(12) United States Patent
Fonash

(10) Patent No.: US 10,930,803 B2
(45) Date of Patent: Feb. 23, 2021

(54) SOLAR CELL REFLECTOR / BACK ELECTRODE STRUCTURE

(71) Applicant: Stephen J. Fonash, State College, PA (US)

(72) Inventor: Stephen J. Fonash, State College, PA (US)

(*) Notice: Subject to any disclaimer, the term of this patent is extended or adjusted under 35 U.S.C. 154(b) by 311 days.

(21) Appl. No.: 15/337,590

(22) Filed: Oct. 28, 2016

(65) Prior Publication Data
US 2017/0110604 A1 Apr. 20, 2017

Related U.S. Application Data

(63) Continuation-in-part of application No. 15/223,545, filed on Jul. 29, 2016.
(Continued)

(51) Int. Cl.
*H01L 31/0224* (2006.01)
*H01L 31/056* (2014.01)
(Continued)

(52) U.S. Cl.
CPC .. *H01L 31/022441* (2013.01); *H01L 31/0236* (2013.01); *H01L 31/02245* (2013.01);
(Continued)

(58) Field of Classification Search
CPC ....... H01L 31/035281; H01L 31/03529; H01L 31/056; H01L 31/02366; H01L 31/02363;
(Continued)

(56) References Cited

U.S. PATENT DOCUMENTS 8,216,872 B1 7/2012 Shieh et al.
2005/0022860 A1* 2/2005 Toh ................. H01L 31/035281
136/251
(Continued)

FOREIGN PATENT DOCUMENTS

WO WO-2013048577 A1 * 4/2013 ....... H01L 31/02366

OTHER PUBLICATIONS

Sheppard, C.J.R, "Approximate calculation of the reflection coefficient from a stratified medium", Pure and Applied Optics: Journal of the European Optical Society Part A (1995), pp. 665-669, vol. 4, Issue 5, Copyright IOP Publishing Ltd. (1995).
(Continued)

*Primary Examiner* — Andrew J Golden
(74) *Attorney, Agent, or Firm* — Blue Filament Law PLLC

(57) ABSTRACT

A photovoltaic or light detecting device is provided that includes a periodic array of dome or dome-like protrusions at the light impingement surface and three forms of reflector/back electrode at the device back. The beneficial interaction between an appropriately designed top protrusion array and these reflector/electrode back contacts (R/EBCs) serve (1) to refract the incoming light thereby providing photons with an advantageous larger momentum component parallel to the plane of the back (R/EBC) contact and (2) to provide optical impedance matching for the short wavelength incoming light. The reflector/back electrode operates as a back light reflector and counter electrode to the periodic array of dome or dome-like structures. A substrate supports the reflector/back electrode.

12 Claims, 13 Drawing Sheets

Related U.S. Application Data

(60) Provisional application No. 62/198,136, filed on Jul. 29, 2015, provisional application No. 62/210,848, filed on Aug. 27, 2015.

(51) Int. Cl.
    *H01L 31/0392* (2006.01)
    *H01L 31/0236* (2006.01)

(52) U.S. Cl.
    CPC .. *H01L 31/022433* (2013.01); *H01L 31/0392* (2013.01); *H01L 31/056* (2014.12); *Y02E 10/52* (2013.01)

(58) Field of Classification Search
    CPC ....... H01L 31/035227; H01L 31/03928; H01L 31/022411; H01L 31/022433; H01L 31/02245; H01L 31/0392; H01L 31/0236
    USPC .................................................. 136/243–265
    See application file for complete search history.

(56) References Cited

U.S. PATENT DOCUMENTS

| | | | |
|---|---|---|---|
| 2005/0172997 A1* | 8/2005 | Meier | H01L 31/056 136/261 |
| 2008/0223436 A1* | 9/2008 | den Boer | H01L 31/056 136/256 |
| 2009/0293934 A1* | 12/2009 | Okada | H01L 31/02168 136/246 |
| 2010/0096012 A1* | 4/2010 | Straub | B32B 17/10036 136/259 |
| 2010/0206362 A1 | 8/2010 | Flood | |
| 2010/0243042 A1* | 9/2010 | Shan | H01L 31/056 136/255 |
| 2011/0048499 A1* | 3/2011 | Myong | H01L 31/076 136/246 |
| 2011/0146794 A1* | 6/2011 | Tsai | H01L 31/02167 136/259 |
| 2011/0186119 A1* | 8/2011 | Atwater | H01L 31/022425 136/256 |
| 2011/0259398 A1* | 10/2011 | Kim | H01L 31/022466 136/246 |
| 2011/0259419 A1* | 10/2011 | Hagemann | H01L 31/056 136/259 |
| 2011/0277827 A1 | 11/2011 | Yang et al. | |
| 2011/0308586 A1 | 12/2011 | Yamazaki | |
| 2012/0125437 A1 | 5/2012 | Okawara et al. | |
| 2012/0240999 A1 | 9/2012 | Yoshida et al. | |
| 2013/0092210 A1* | 4/2013 | Fonash | H01L 31/022425 136/244 |
| 2013/0092229 A1 | 4/2013 | Xue et al. | |
| 2013/0112236 A1 | 5/2013 | Bhan et al. | |
| 2013/0192663 A1* | 8/2013 | Fonash | H01L 31/02363 136/246 |
| 2013/0213463 A1* | 8/2013 | Yi | H01L 31/022425 136/255 |
| 2013/0220406 A1 | 8/2013 | Day et al. | |
| 2014/0252313 A1 | 9/2014 | Mariani et al. | |
| 2014/0261612 A1 | 9/2014 | Smith et al. | |

OTHER PUBLICATIONS

Haug, F.J. et al., "Influence of the ZnO buffer on the guided mode structure in Si/ZnO/Ag multilayers", Journal of Applied Physics, Sep. 2009 (Published Online: Aug. 19, 2009), pp. 044502-1-044502-7, vol. 106, Copyright American Institute of Physics (2009).

Fonash, Stephen, "Solar Cell Device Physics; 2nd Edition", Published Apr. 13, 2010, Copyright Academic Press and Elsevier Inc. (2010).

Ferry, V.E., Polman, A., Atwater, H.A., "Modeling Light Trapping in Nanostructured Solar Cells", ACS Nano, Dec. 27, 2011 (Published Online: Nov. 14, 2011), pp. 10055-10064, vol. 5, Issue 12, Copyright American Chemical Society (2011).

Nam, Wook Jun et al., "Exploration of nano-element array architectures for substrate solar cells using an a-Si:H absorber", Journal of Applied Physics, Published Online: Jun. 19, 2012, pp. 123103-1-123103-6, vol. 111, Copyright American Institute of Physics (2012).

Kim, Jeehwan et al., "9.4% Efficient Amorphous Silicon Solar Cell on High Aspect-Ratio Glass Microcones", Advanced Materials, Jun. 25, 2014 (Published Online: Mar. 20, 2014), pp. 4082-4086, vol. 26, Issue 24, Copyright Wiley-VCH Verlag GmbH & Co. KGaA, Weinheim (2014).

\* cited by examiner

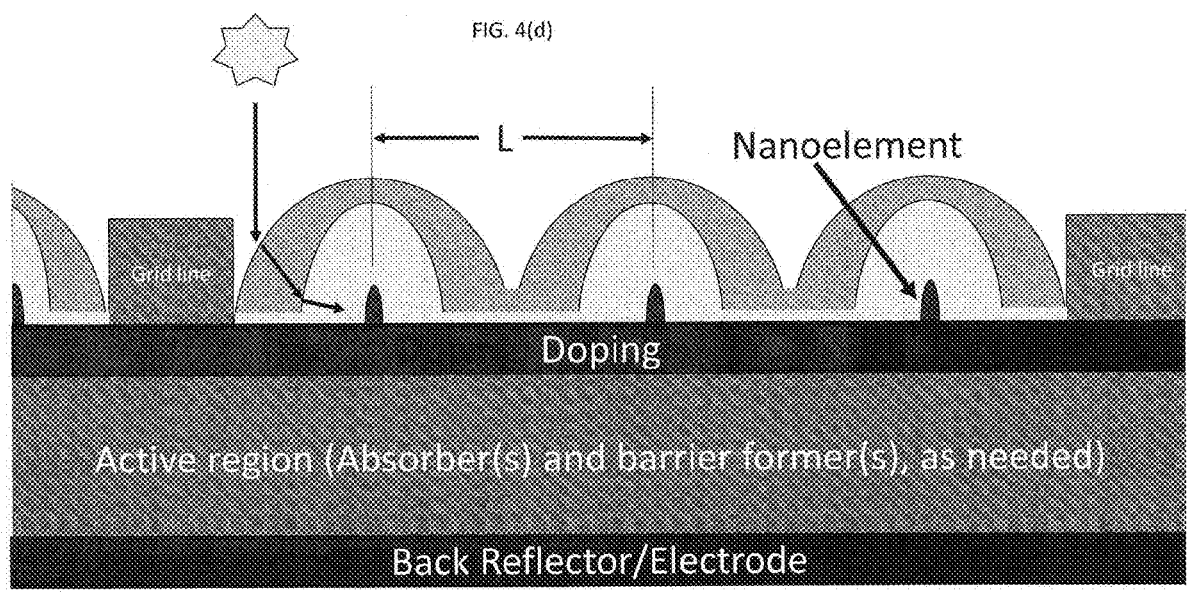

SOLAR CELL REFLECTOR / BACK ELECTRODE STRUCTURE

RELATED APPLICATIONS

This application is a non-provisional application is a continuation-in-part of U.S. Non-Provisional application Ser. No. 15/223,545 filed Jul. 29, 2016 that in turn claims priority benefit of U.S. Provisional Application Ser. No. 62/198,136 filed Jul. 29, 2015; and U.S. Provisional Application Ser. No. 62/210,848 filed Aug. 25, 2015; the content of both of which are hereby incorporated by reference.

FIELD OF THE INVENTION

The present invention relates in general to photovoltaic (e.g., solar cell) or light detecting devices and in particular to a protrusion array—reflector/back electrode structure performing an optical refraction/reflection function thereby affording superior performance as measured by effectiveness, cost, or both.

BACKGROUND OF THE INVENTION

Solar cells traditionally have normally resorted to structures having textured (usually random) front surfaces and metal layer(s) back reflector/electrode structures to serve generally in both electrical conduction and optical roles (1). Metals have the advantage in the back of being able to serve as both reflector and conducting back electrode. Because of its excellent reflectivity, conductivity, and chemical properties, silver is usually the metal of choice for the reflector/electrode back contact (R/EBC) use. However, its cost can be a factor, especially in large device area applications such as solar cells. The processing step needed to apply a back reflector/electrode metal can also be time-consuming and costly, especially if it involves vacuum deposition. In these devices effectiveness as well as materials and manufacturing costs, or both are factors to be considered. The back reflector/electrode structure that would be very useful is one that would not degrade performance to any significant extent, if at all, when utilized and yet would avoid the use of an expensive metal thereby being beneficial by mitigating device cost considerations, removing metal chemical reactivity considerations, removing plasmonic loss possibilities (2-4), and simplifying processing. Such a back reflector/electrode structure employed as part of an architecture that also avoided the use of front texturing for light management would be excellent. Eliminating texturing, which often involves chemical etching or random surface growth, would improve processing. Thus, there exists a need for a solar cell architecture that is free of an expensive metal layer performing an optical reflector function and free of the use of texturing.

In recent work, Kim et al. (4) used a 200 nm ZnO:Al back contact for a superstrate a Si:H thin film solar cell on glass microcone features on a glass substrate. Here the notation ZnO:Al represents Al doped ZnO (commonly denoted as AZO). The microcones with a base diameter D~1.5 µm were formed by employing a hard mask on, and then reactive ion etching (RIE), the glass substrate. These randomly positioned microcones were reported to have an aspect ratio A~2 where this aspect ratio for microcones was defined as A=H/D, where H is the microcone height and D is its base dimension. Kim et al. termed A=H/D≥2 a high aspect ratio and their ~2 microcones to be 3-D features (4). To explore increasing the performance of these superstrate cells, Kim et al added a back-reflector (BR) on the back of their solar cells. This BR was of the form of a ZnO:Al/Ag BR for some cells and of the form ZnO:Al/TiO BR for others. In this latter BR case, the TiO was in the form of nanoparticles. Performance of the ZnO:Al/Ag BR and ZnO:Al/(nanoparticle) TiO BR structures was compared to what they termed the "none BR ZnO:Al [AZO] back contact". It was found that the ZnO:Al/(nanoparticle) TiO BR structure performed the best and the "none BR ZnO:Al [AZO] back contact" was the next best. Devices with the ZnO:Al/(nanoparticle) TiO BR were reported to give about 5% more short circuit current than the none BR ZnO:Al [AZO] back contact (4).

SUMMARY OF THE INVENTION

A photovoltaic or light detecting device is provided that includes a periodic array of dome or dome-like protrusions at the light impingement (front) surface and one of three reflector/back electrode designs at the device back (or rear). The beneficial interaction between an appropriately designed top protrusion array and these reflector/electrode back contacts (R/EBCs) serves (1) to refract the incoming light in a manner to thereby provide photons with an advantageous larger momentum component parallel to the plane of the back (R/EBC) contact and (2) to provide optical impedance matching for the short wavelength incoming light. Each reflector/back electrode form operates as a back light reflector and counter electrode to the periodic array of dome or dome-like structures. A substrate supports the reflector/back electrode.

BRIEF DESCRIPTION OF THE DRAWINGS

The present invention is further detailed with respect to the following drawings. These drawings are not intended to limit the scope of the appended claims, but rather to illustrate specific embodiments thereof. These drawings are not necessarily to scale.

FIGS. 4(a)-(d) Schematics showing various schemes (a)-(d) for positioning of dome or dome-like protrusion arrays between grids in front contact/back contact terminal configuration.

DESCRIPTION OF THE PREFERRED EMBODIMENTS

Figure 1A:
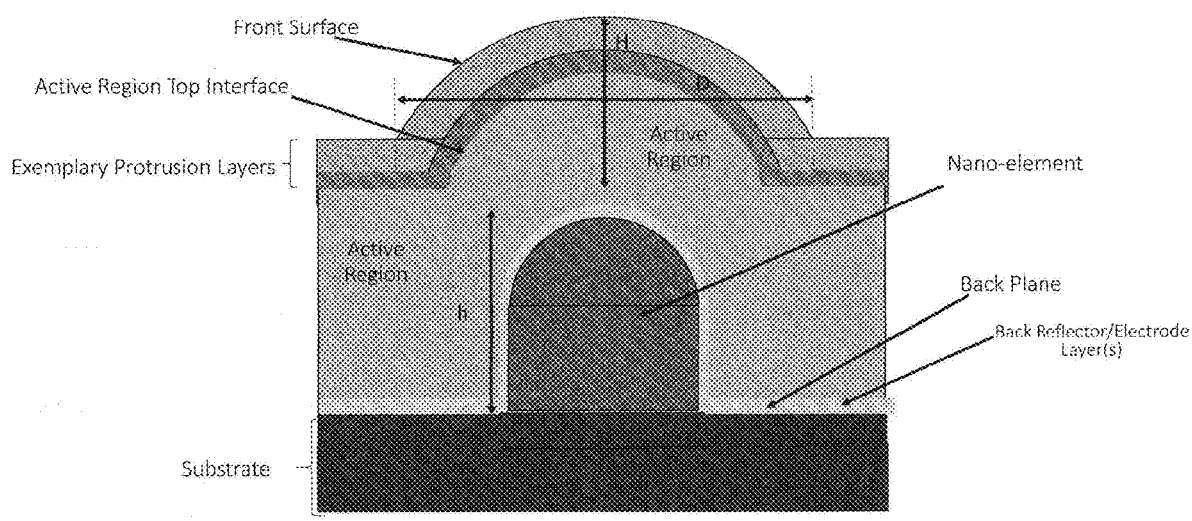
FIG. 1(a) is a schematic cross-sectional view of an inventive embodiment in which nanoelements underlying each one of a periodic array of dome or dome-like protrusions are embedded within an active region.

The following detailed description is merely exemplary in nature and is in no way intended to limit the scope of the invention, its application, or uses, which may vary. The invention is described with relation to the non-limiting definitions and terminology included herein. These definitions and terminology are not designed to function as a limitation on the scope or practice of the invention, but are presented for illustrative and descriptive purposes only.

Various terms used throughout the specification and claims are defined as set forth below as it may be helpful to an understanding of the invention.

A metal-less back reflector/electrode for photovoltaic and light detection devices of the substrate configuration based on transparent conductive materials (TCMs) is one in which a metal plays no significant optical role.

As used herein, "metal-less" back reflector-electrode or equivalently "metal-less" reflector-electrode back contact (R/EBC) denotes a structure (Forms (2) and (3)) wherein the one or more layers of this back reflector-electrode contact structure is devoid of any metal film having a significant optical function. The metal layer(s) normally used in back reflector/electrode structures for their optical role is (are) simply not present in Forms (2) and (3) of the invention. A metal may lie behind a metal-less R/EBC in various configurations of this invention but, if present, it has no required optical function and serves only as an electrical conduit (i.e., contact or interconnect, or both) and perhaps a structural support. Exemplary of reflector and electrode functioning metal films in Form (1) metal R/EBCs is an Ag layer which is often employed in such structures.

The phrase "front surface of a photovoltaic or light detecting device" denotes the air/device region where incoming light first impinges. Correspondingly, the other side of the device is being denoted as the back (or rear) surface. These definitions apply to both superstrate and substrate device configurations. In conventional devices, the back surface region is often designed to reflect impinging light back through the device to enhance its utilization. Bragg reflectors with their layers of non-conducting dielectrics can be used for back reflectors (1). However, metals are most commonly utilized together with randomized front texturing.

The phrase "dome-like" denotes an aspect protruding above a top planar surface, relative to the direction of normal light impingement. Each protrusion is imprinted, molded, deposited. or alternatively disposed over a nano-element "seed" having a conical, pyramidal, cylindrical, or other shaped aspect. In this latter case, the disposition technique employed (e.g., PECVD, printing, spraying, ablation) and the seed for producing the protrusion layers control the shape of the protrusion layers.

In the invention disclosed herein, a back reflector/electrode for photovoltaic and detection devices of the substrate configuration is utilized for its optical coupling to the protrusion array eliminating or minimizing plasmonic losses in Forms (1)-(3) R/EBCs. The fabrication of this back reflector/electrode for a substrate device does not use the steps of hard mask deposition and etching of Kim et al. and it is not limited to the glass substrates of Kim et al. Uniquely, the invention reported here employs periodically arrayed dome or dome-like layered protrusions which are positioned at the front surface (FIG. 1) and layered as schematically indicated in FIG. 2 in a cross-sectional view. The resulting refraction of impinging light redirects that light as seen in FIG. 2. This redirection is due to the shape of the dome or dome-like protrusions as seen in FIG. 2 and the variation of the indices of refraction of its layers.

The shape requirement for the layers of a protrusion for beneficial redirection properties may be quantified by employing the (normalized) surface normal vector n̂ at two successive surface points along a ray path; i.e., points 1 and 2 of FIG. 2. The shape requirement for any two successive dome or dome-like layers in a protrusion can then be stated as: the horizontal component of the normalized surface normal vector at point 2 must be equal to or larger than the horizontal component of the normalized surface normal vector at point 1. The horizontal direction is defined by the "back plane" in FIGS. 1(a)-(d). Layer indices of refraction must increase or at least remain constant as the impinging light penetrates deeper into the photovoltaic or light detecting device. The objective of this protrusion orientation being away from the device (FIG. 1), the protrusion topology, and the varying indices of refraction is to increase the component of the impinging photon momentum parallel to the planar region (defined by the back plane) of the back electrode depicted in FIGS. 1(a)-1(d).

The fabrication of this protrusion array—back reflector/electrode architecture for a substrate device does not use steps such as hard mask deposition and etching and it is not limited to the use of glass substrates. As noted, the invention reported here employs "dome protrusions" or "dome-like protrusions" which are positioned at the front surface as schematically indicated in FIGS. 1(a) and 1(b) cross-sections, FIG. 1(c) planar view, and in FIG. 1(d) perspective view.

These protrusions may include multiple layers, one or more of which may be the top electrode (a TCM). In particular, the protrusion may be covered by the top electrode as in FIGS. 1(a) and 1(b). These protrusions may include multiple layers, one or more of which may be part of the active region, as seen in FIG. 1(a). The active region includes at least one of the absorber(s) and built-in electrostatic and/or effective field forming layers. Layer indices of refraction n must increase or at least remain constant as the impinging light penetrates deeper through protrusion layers. In the case where the active region has an active layer top surface that is at least partially in the protrusion, as seen in FIG. 1(a), the terminal protrusion layer before the active region has an n less than or essentially equal to that of the active region being encountered. In the case where the active layer top surface is not in the protrusion but is planar with the protrusions disposed thereon, as seen in FIG. 1(b), the terminal protrusion layer before the active region has an n larger or essentially equal to than that of the active region being encountered.

Figure 1B:
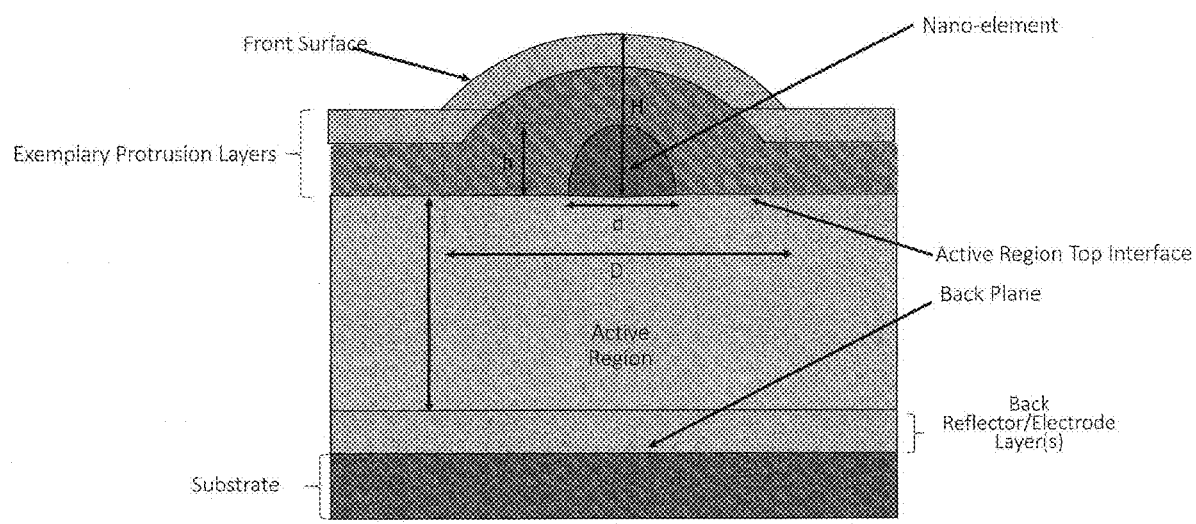
FIG. 1(b) is a schematic cross-sectional view of an inventive embodiment in which nanoelements underlying each one of a periodic array of dome or dome-like protrusions are positioned on top of an active region
Figure 1C:
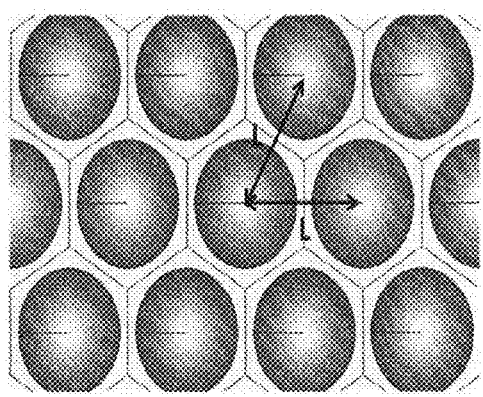
FIG. 1(c) is a planar view of the top electrode surface of the periodic array of dome or dome-like protrusions of either of the aforementioned drawings with no attempt made to depict an optimized flat area among domes.
Figure 1D:
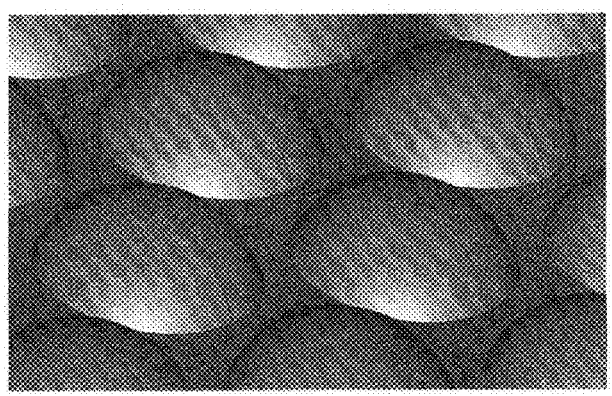
FIG. 1(d) is a perspective view of the top electrode surface of the periodic array of dome or dome-like protrusions either FIG. 1(a) or FIG. 1(b) with no attempt made to depict an optimized flat area among domes.
Figure 2:
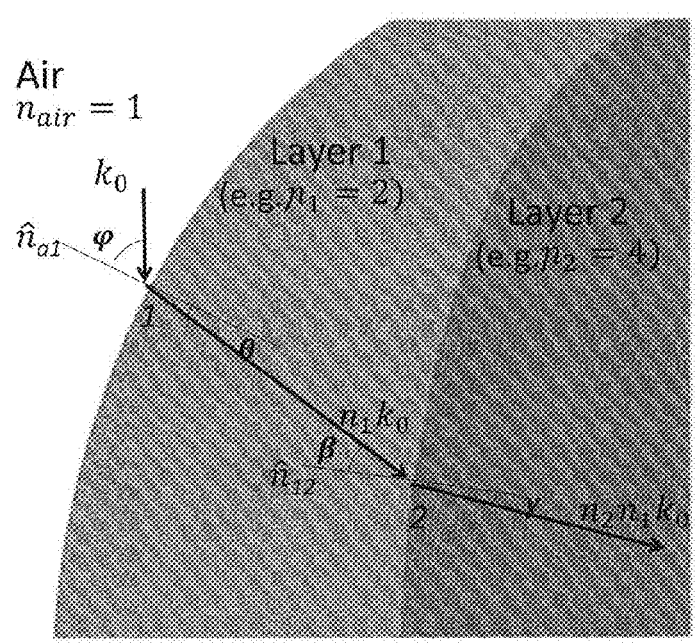
FIG. 2 is a close up of a portion of two successive interfaces in a dome or dome-like protrusion as depicted in the aforementioned drawings; with refraction indices of materials selected to induce an incident photon redirection.

The objective of having protrusion orientation pointing away from the device (FIGS. 1(a) and 1(b), the protrusion topology, and the varying indices of refraction is to increase or at least maintain the component of the impinging photon momentum parallel to the back plane depicted in FIGS. 1(a) and 1(b); i.e., to increase the parallelity to the back contact of the impinging photon momenta.

Broadly speaking choosing a dome or dome-like protrusion base dimension D, height H, and spacing L shown in FIGS. 1(a)-1(d), as well as the resulting aspect ratio A=H/D affects the efficacy of the momentum change function of these protrusions. Choosing these aspects of the topology as well as the layer by layer n variation and the amount of front surface covered by the protrusion base affects the impact of these characteristics on increasing the component of the impinging photon momentum parallel to the back plane (denoted in FIGS. 1(a)-1(d)). For a given D, the protrusion surface area should be made as large as possible and the amount of the front surface area not covered by protrusions (See FIGS. 1(c) and 1(d) should be made as small as possible subject to processing and economic constraints. For example, using uniform domes or dome-like protrusions of base dimension D which just touch in a hexagonal periodic pattern of spacing L will produce a protrusion covered front surface percentage of 90%. This is not achieved in FIGS. 1(c) and 1(d), for drawing clarity.

To function, the protrusion array—reflector/back electrode structure of the invention disclosed herein requires refracting dome or dome-like structures with the properties described and oriented to protrude away from the R/EBC as seen in FIGS. 1(a)-1(d). The inventive protrusion array—reflector/back electrode (Forms (1)-(3)) architecture of this invention does not necessitate an aspect ratio A such that A≥2 and therefore the architecture mitigates against the possibility of performance degradation due to sharp features. The important dimensions of the inventive protrusion array—reflector/electrode back contact architecture are the D, H, and L of the dome or dome-like protrusions; they define the topological features shown in FIGS. 1(a)-1(d) including the size of the flat regions among the dome or dome-like structures. While not shown in FIGS. 1(a)-1(d), these flat regions may contain additional, smaller dome or dome-like features also which are positioned randomly or systematically among the protrusions of FIGS. 1(a)-1(d). Additionally, protrusion features and flat region features may (not shown) or may not be textured (random topology).

The nano-elements of dimensions h, d, and L as seen in FIGS. 1(a)-1(d), if present, are seeds utilized mainly to guide protrusion formation during disposition of the dome or dome-like features or layers thereof and may be made using vacuum or non-vacuum deposition steps such as molding, printing, probe printing, etching, and imprinting processing. Their formation does not require glass hard-mask etching. The dome or dome-like protrusion array and the reflector/electrode back contacts function with, or without, the presence of the nano-element seeds of FIGS. 1(a) and 1(b). As noted earlier, the key aspect of the reflector/back electrode invention disclosed herein is the refraction caused by the dome or dome-like features at the front surface. The back reflector/electrode part of this architecture may utilize substrates such as metal foils, glass foils, and organic materials illustratively including polyacetylene, polyphenylene vinylene, polypyrrole, polythiophene, polyaniline polyimide, or polyphenylene sulfide. The back reflector/electrode serves as the counter electrode to the front electrode which itself is the top layer of or is at least a part of the dome-like structures or of the active region.

Figure 3:
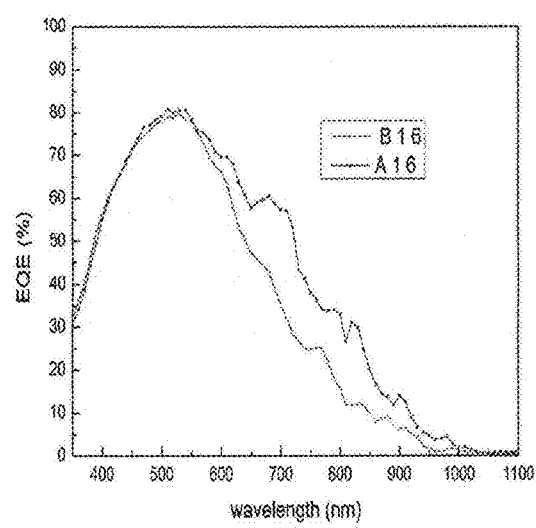
FIG. 3 is a plot of an experimental EQE for two solar cell structures, where both have domes on the front surface with the arrangement seen in FIG. 1(a) but sample A16 has a metal-less AZO reflector/back electrode contact whereas sample B16 has a metal Cr reflector/back electrode contact. The response of sample A16 is seen to be superior to B16, especially in the "red" wavelengths".

The metal-less reflector/back electrode structure, Form (2) of the three R/EBC forms of the invention disclosed herein, performs very well as seen from Tables I and II and FIG. 3. Form (2) is seen from the description and FIGS. 1(a)-(d) and 2 to differ from the back contacts of Kim et al. in a number of aspects including: (1) The back contacts of Kim et al. are for superstrate devices; (2) the "none BR ZnO:Al [AZO] back contact" of Kim et al. is labeled a non-back reflector structure whereas in the innovative Form (3) structure here a ZnO:Al [AZO] back contact would be specifically designed to function as a metal-less back reflector/electrode contact; (3) the refracting dome or dome-like structures of our invention are oriented to protrude away from the device absorber as seen in FIG. 1(a)-(d) whereas the corresponding refracting structures of Kim et al are protruding into the device absorber; (4) our metal-less (Form (2)) reflector/back electrode back contacts do not necessitate A ≥ 2 and therefore mitigate against the possibility of performance degrading sharp features; (5) the important dimensions of our metal-less reflector/electrode back contacts are the D, H, and L of the periodic dome or dome-like features whereas they are the height and base of microcones for Kim et al.; (6) the boundaries of our structure defining the region to be filled with the active region are smooth thereby also helping to avoid the sharp boundary problematic features possible in the back contacts of Kim et al.; (7) the nano-elements seen in FIGS. 1(a) and 1(b) correspond to the microcones of Kim et al. but are made using techniques such as non-vacuum molding, probe printing, or imprinting processing and not glass hard-mask etching; (8) the metal-less reflector/electrode back contacts of this invention do not involve the use of nanoparticles in the R/EBC and therefore do not involve the use of the concomitant nanoparticle application step; and (10), as seen in Table II, the Form (2) metal-less reflector/back electrode contacts of this invention function essentially equally well with, or without, the presence of the nano-elements of FIGS. 1(a) and 1(b). As noted earlier, the key aspect of the protrusion array—reflector/back electrode architecture disclosed here is the refraction caused by the protruding, periodic dome or dome-like features on the front surface and their optimal shape and index of refraction variations with successive layers.

Modeling results used in the study of and design of the protrusion array—Form (2) metal-less reflector/back electrode architecture of this invention are summarized in Table I for the case of a metal-less AZO back reflector/(Form (2)) contact and, for comparison, for several metal back reflector/electrode (Form (1)) contacts using several types of metals. These comparisons are reported for front surface dome cells using solar cell short circuit current Jsc results for nc-Si absorbers of 400 nm thickness. The fact that a protrusion array—metal-less R/EBC (Form (2)) is seen to perform almost as well as a protrusion array—silver (Form (1)) contact is outstanding.

Table II gives results for metal-less AZO back reflector/electrode contacts with nano-elements and without nano-elements. These results underscore the crucial role of the dome or dome-like structures of the front surface in reflector/electrode back contact devices. These results make it apparent that the nano-element principally plays a role in the fabrication process of shaping the dome or dome-like structures, if utilized.

Table 1. Jsc values for various protrusion array—metal reflector/electrode back (Form (1)) contact cells and a protrusion array—metal-less R/EBC (Form (2)) cell.

TABLE I

Jsc for Various Metal Reflector/Electrode Back Contact Cells and a Metal-less Cell All with Domes ($t_{eff}$ = 434 nm)

| Configuration | Jsc (mA/cm^2) |
|---|---|
| Ag dome solar cell | 30.64 |
| Cr dome solar cell | 22.6 |
| Al dome solar cell | 25.71 |
| Au dome solar cell | 28.54 |
| Metal-less (AZO) dome solar cell | 28.7 |

Table II Protrusion array—Form (2) metal-less AZO reflector/back electrode ncSi cells on polyimide. Cases with and without (w/o) nanoelements and with the absorber thickness adjusted ($t_{eff}$) for absence of the nanoelement are given.

Metal-less AZO reflector/back electrode ncSi cells on polyimide (Absorber thickness t was 400 nm but this was reduced for the case when the nano-element was not present)

| configuration | On PI |
|---|---|
| AZO Metal-less | 29.53 mA/cm^2 |
| AZO Metal-less w/o nanoelement | 29.14 mA/cm^2 |
| AZO metal-less w/o nanoelement + teff adjusted | 29.08 mA/cm^2 |

An experimental comparison of the performance of two dome substrate solar cell devices with R/EBC Form (2) metal-less reflector/back electrode back contacts (ZnO:Al back contacts) and with R/EBC Form (1) metal reflector/back electrode back contacts (i.e., Cr back contacts) is presented in FIG. 3. Both have domes on the front surface implemented using the nano-elements of FIG. 1(a) but sample A16 has a metal-less AZO reflector/back electrode contact whereas sample B16 has a Cr reflector/back electrode contact. Chromium was employed here since it has high plasmonic losses in the wavelength region of interest. The red wavelength region response of sample A16 is seen to be superior due to the avoidance of plasmonic losses. These losses are present with the involvement of a metal (B16) as part of the back contact.

As Table III makes clear, protrusion array—Ag R/EBC (Form (1)), protrusion array—metal-less R/EBC (Form (2)), and protrusion array—thick TCM/metal R/EBC (Form (3)) structures perform much better than the corresponding planar (no protrusion array) control cell. As may be further discerned, protrusion array—Ag R/EBC (Form (1)) structures perform only somewhat better than the corresponding protrusion array—metal-less R/EBCs (Form (2)). However, the latter has the distinct advantage of avoiding the use of an expensive metal. Table III makes the extremely interesting point that the protrusion array—thick TCM/Al R/EBC (Form (3)) architecture provides excellent performance. In fact, Table III shows that the short circuit current performance of the protrusion array—thick TCM/Al R/EBC can be better than that of the other two forms of R/EBCs. In other words, this protrusion array—thick TCM/Al R/EBC (Form (3)) architecture can avoid the use of Ag yet give performance equal to, or even somewhat better than, protrusion array—Ag R/EBC (Form (1)) architecture.

All the forms of the protrusion array—R/EBC architecture disclosed herein may be utilized with thin or thick active regions composed of at least one barrier forming and at least one absorber material. Thick active regions may be, for example, what are termed wafers. All the forms of the protrusion array—R/EBCs architecture disclosed herein used one of the three R/EBCs forms listed in Table III. The disclosed architecture, in its various forms, may be employed in cells with a front contact/back contact arrangement; i.e., the +terminal is on one side of the cell and the −terminal is on the other side. The disclosed architecture, in its various forms, may also be employed in cells with a back contact/back contact arrangement; i.e., both the + and −cell terminals are on the back side of the cell.

Figure 4A:
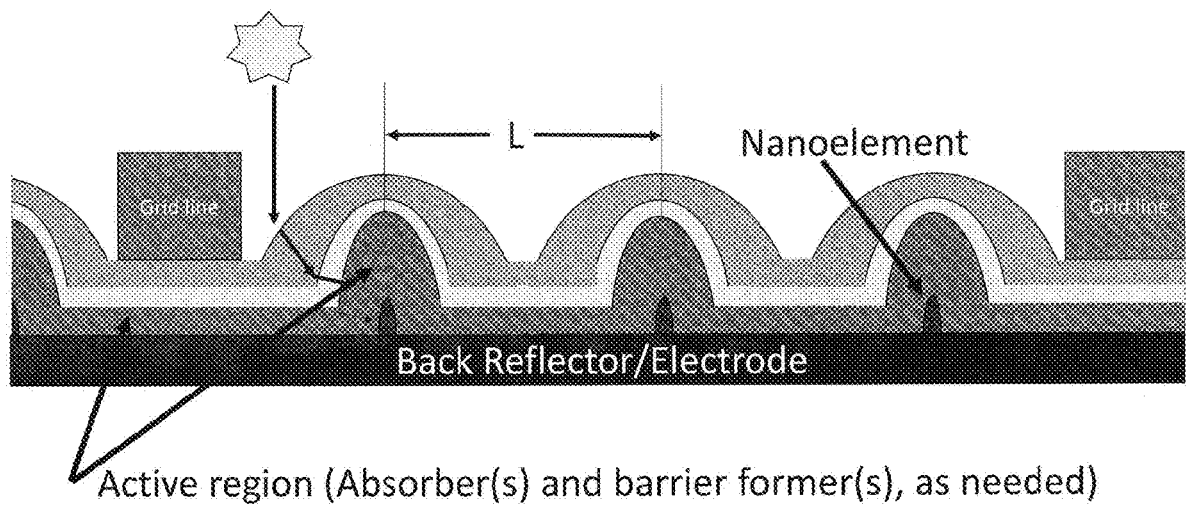
Figure 4B:
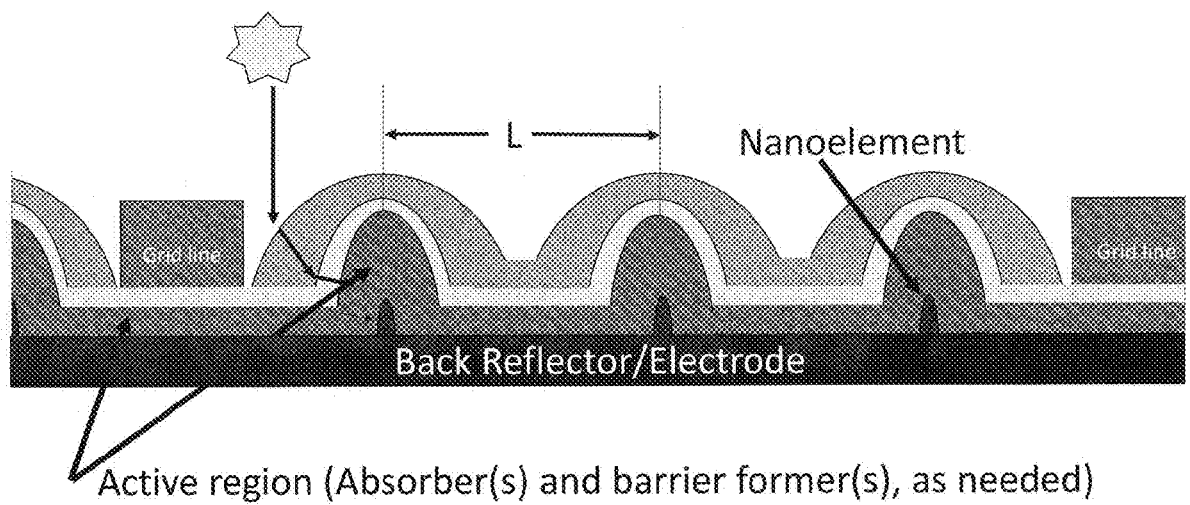

The front contact/back contact arrangement is characterized by a front collection grid (of TCM or metal materials). In this case, the architecture of this invention has protrusion positions located in between these current collecting grid lines, as shown in FIGS. 4(a)-(d). As seen in FIG. 4(a), the grid lines may be disposed, in the thin active region case, after all protrusion layers are present, if these layers are transparent conductive materials (TCMs). This insures front current collection. Alternatively, they may be positioned on any TCM layer of the protrusion which provides electrical continuity to the active region, as shown schematically in FIG. 4(b). In this scheme, the transparent layers in the protrusion above this contacted TCM layer (one is shown in the example of FIG. 4(b)) need not be conducting. One or more may be passivating, encapsulating, or protecting the cell structure.

TABLE III

Architecture comparison

| Cell architecture | Features | Best $J_{SC}$ for this architecture |
|---|---|---|
| Planar top surface control-metal (Form (1)) R/EBCs | Conventional. No protrusion array but same metal R/EBCs as is used in Form (1) | 18.0 mA/cm² for Ag R/EBC |
| (1) Protrusion array-metal (Form (1)) R/EBCs | Metal R/EBCs together with protrusion array. May have an ultra-thin (~0.5-10 nm) optical spacer, and/or contact or selective contact layer over the front of the metal. | 30.7 mA/cm² for protrusion array--Ag R/EBCs |

TABLE III-continued

Architecture comparison

| Cell architecture | Features | Best $J_{SC}$ for this architecture |
| --- | --- | --- |
| (2) Protrusion array-metal-less all TCM (Form (2)) R/EBCs | Nonmetal R/EBCs together with protrusion array, One or more TCM layers involved in providing R/EBCs function which thereby determines TCM thickness. May have a metal at the backmost region with no significant optical function but serving as a contact and/or grid and/or mechanical support. May have an ultra-thin (~0.5-10 nm) optical spacer, and/or contact or selective contact layer over the front of the TCM region. | 29.5 mA/cm² for protrusion array-- AZO R/EBCs |
| (3) Protrusion array--thick TCM/metal (Form (3)) R/EBCs | Both TCM + Al (for cost saving) are involved in R/EBCs function and has protrusion array. May have an ultra-thin (~0.5-10 nm) optical spacer, and/or contact or selective contact layer over the front of TCM region. | 30.8 mA/cm² for protrusion array-- AZO/Al R/EBCs |

The nanoelements which may be used to control the protrusion locations in these schemes are positioned between the grid areas. This is done by approaches such as probe-type, molding, printing, or imprinting-type nanoelement positioning.

Figure 4C:
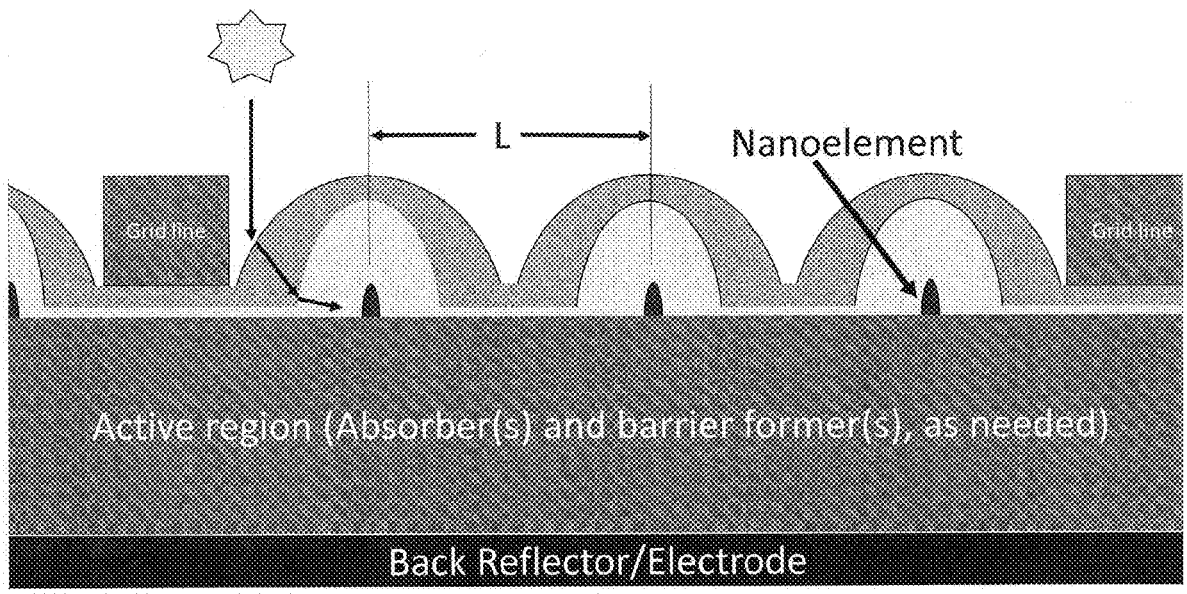

As seen in FIG. 4(c), grid lines may be positioned in a planar surface active region case after all protrusion layers are present, if these layers are transparent conductive materials. They also may be positioned on any TCM protrusion layer which provides electrical continuity to the active region. This latter case corresponds to FIG. 4(b) and its discussion. Another approach is to etch all the disposed protrusion films off thereby defining grid areas and subsequently forming the grids through steps involving standard lithography/deposition/etching processing. The etching would be done down to a doping layer as seen in FIG. 4(d). The analogous processing can be done for the case in which the absorber region is in the protrusion with the corresponding doping layer incorporated into the active region.

Figure 5A:
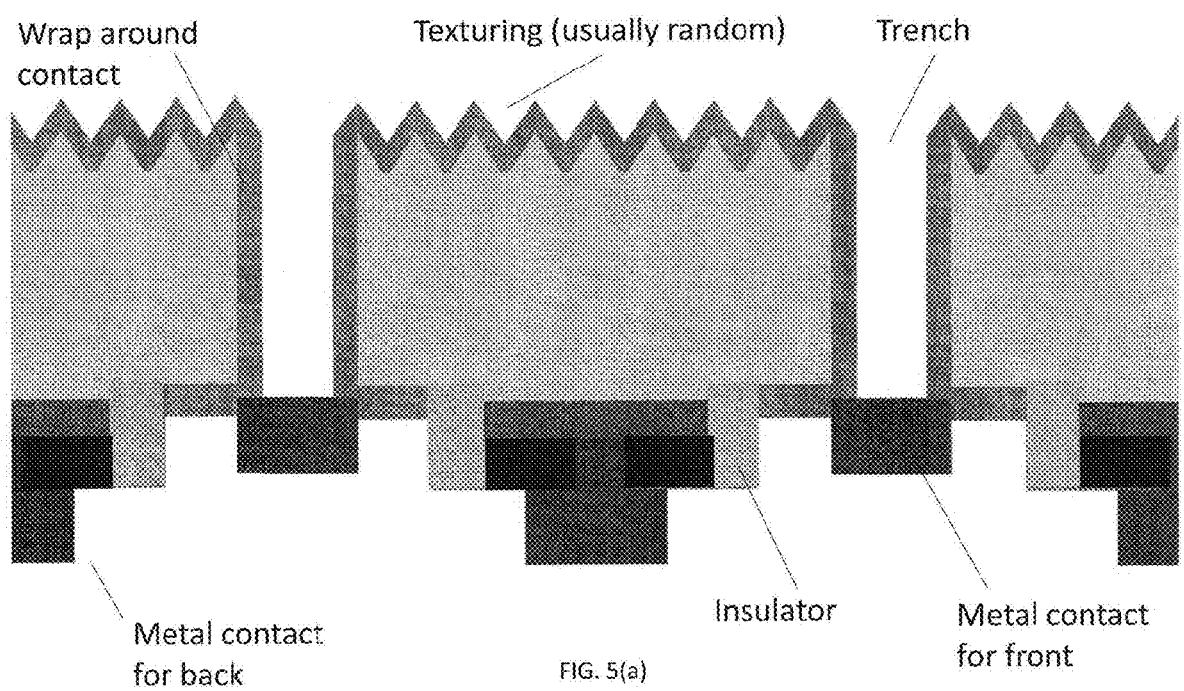
FIG. 5(a) State-of-the-art example of a back contact/back contact arrangement in which texturing (usually random) has been utilized at the front. (b) back contact/back contact arrangement in which the texturing has been replaced with a protrusion array. Any of the three forms of the R/EBCs listed in Table III may be employed with the protrusion array FIG. 6(a) The computed $A(\lambda)$ plot for a protrusion array—Form (2) R/EBC using AZO as the transparent conducting material (TCM). (b) The computed $A(\lambda)$ plot for a protrusion array—Form (3) thick TCM/metal BR/E cell of the structure AZO/Al. In both (a) and (b), the resulting $J_{SC}$ values are given in the insets. Both (a) and (b) also have the computed $A(\lambda)$ plot for a protrusion array—Form (1) Ag BR/E cell as well as the theoretical Yablonovich limit (YL).
Figure 5B:
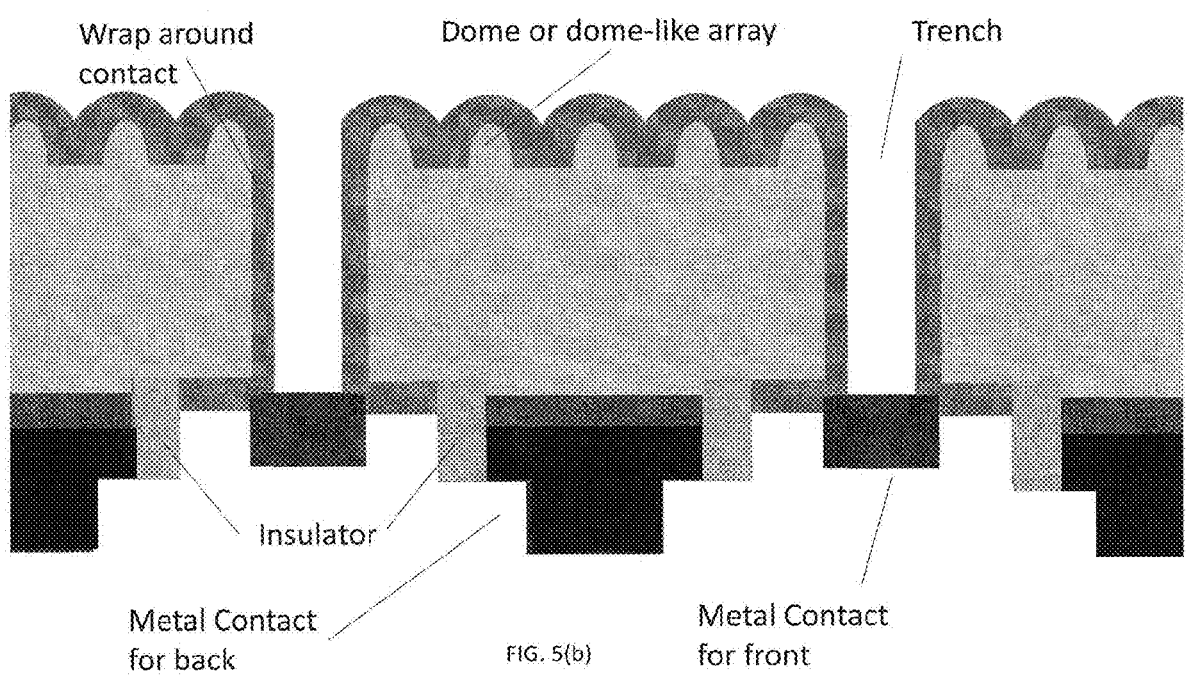

In the case of a back contact/back contact arrangement, both the + and –cell contacts are on the back side of the cell. This results in two sets of contacts at the back. FIG. 5(a) gives a state-of-the-art example, for comparison, of a back contact/back contact arrangement in which texturing has been utilized at the front. As seen from FIG. 5(a), some method must be used to bring the front electrode current and voltage to the cell back. In the examples of FIG. 5, this is accomplished by a so-called "wrap-around" approach using trenching with the trench containing the required current carrier material. FIG. 5(b) shows the type of back contact/back contact arrangement in which the texturing of FIG. 5(a) is replaced with the protrusion array disclosed herein. Any of the three forms of the R/EBCs listed in Table III may be employed with the protrusion array in back contact/back contact arrangements. Whichever R/EBC is utilized, it obviously must be located at the back in FIG. 5(b) to not short circuit to the contact coming from the cell front.

Since L is the spacing between the protrusions (and essentially the same as D), as well as being the spacing between, if used, the nanoelements seeding the protrusions in their hexagonal lattice, the spacing in between trench edges in FIG. 5(b) should be roughly equal to or somewhat larger than mL where m is an integer number. However, this protrusion array spacing constraint may not be strictly followed if not doing so advantageously reduces cost and increases simplicity.

Returning to the structure of the back reflector/electrodes, it is noted that the periodic protrusion array—R/EBC architecture of this invention in its Form (2) and Form (3) versions of Table III can require optimization of the TCM series resistance versus the optical effectiveness for these types of architecture. This can be done using a variety of thicknesses and of TCMs including topological 2-D materials such as graphene. The TCM layer thickness in the R/EBC of a Form (2) R/EBC cell may lie in the range of about 0.2 to 400 nm or thicker depending on the resistivity and transmissivity of the TCM used. The TCM layer thickness in the R/EBC of a Form (3) R/EBC cell may lie in the range of about 0.2 to 400 nm or thicker as dictated by the resistivity and transmissivity of the TCM.

Figure 6A:
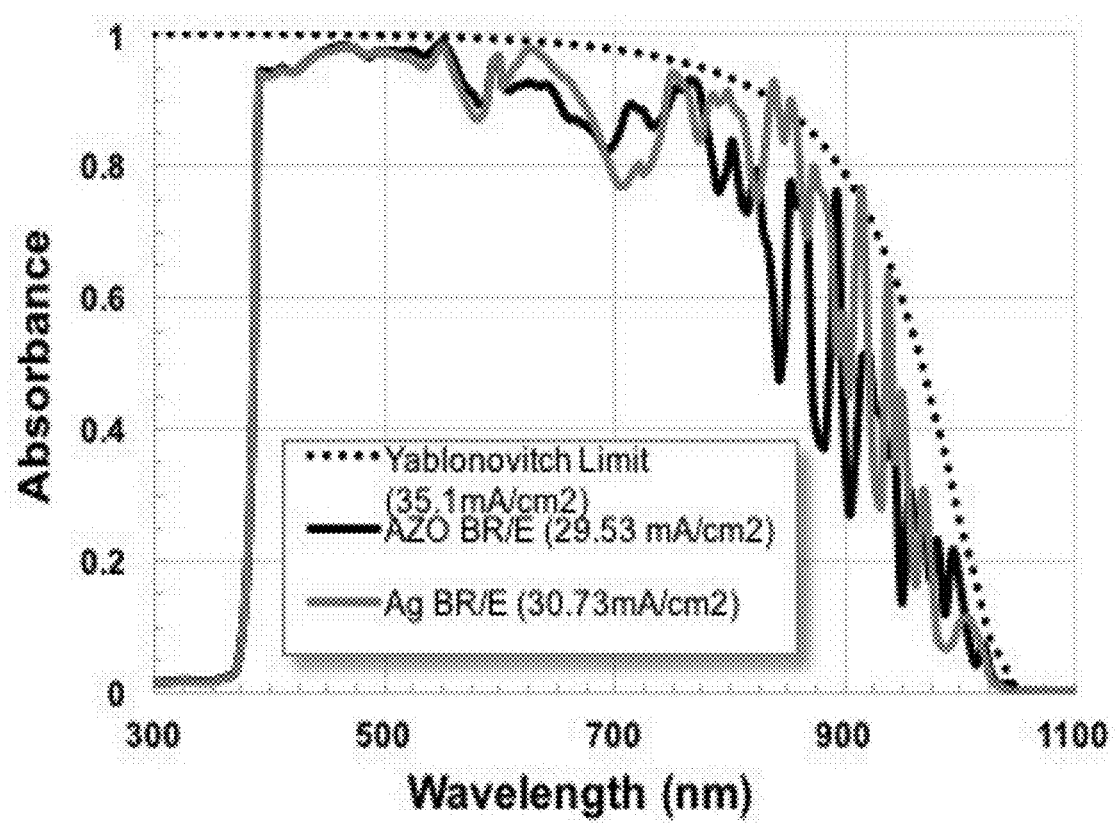

The experimental (FIG. 3) and modeling (FIG. 6a) results for protrusion array cells with Form (2) R/EBCs demonstrate that excellent performance can be obtained from the protrusion array-metal-less all TCM R/EBC (Form (2)) cell architecture. In the experimental and modelling results presented, AZO is the TCM employed in a metal-less R/EBC device. Other TCMs including 2-D materials such as graphene may be utilized. The results given in FIG. 6(a) and listed in Table III show specifically that protrusion array metal-less AZO R/EBCs can achieve, counterintuitively, $J_{SC}$ performances which are almost as good as protrusion array-Ag R/EBC Form (1) cells. As noted earlier, this obviously offers the avoidance of the use of Ag or any other metal film with an optical function within the R/EBC of cells, when advantageous.

Figure 6B:
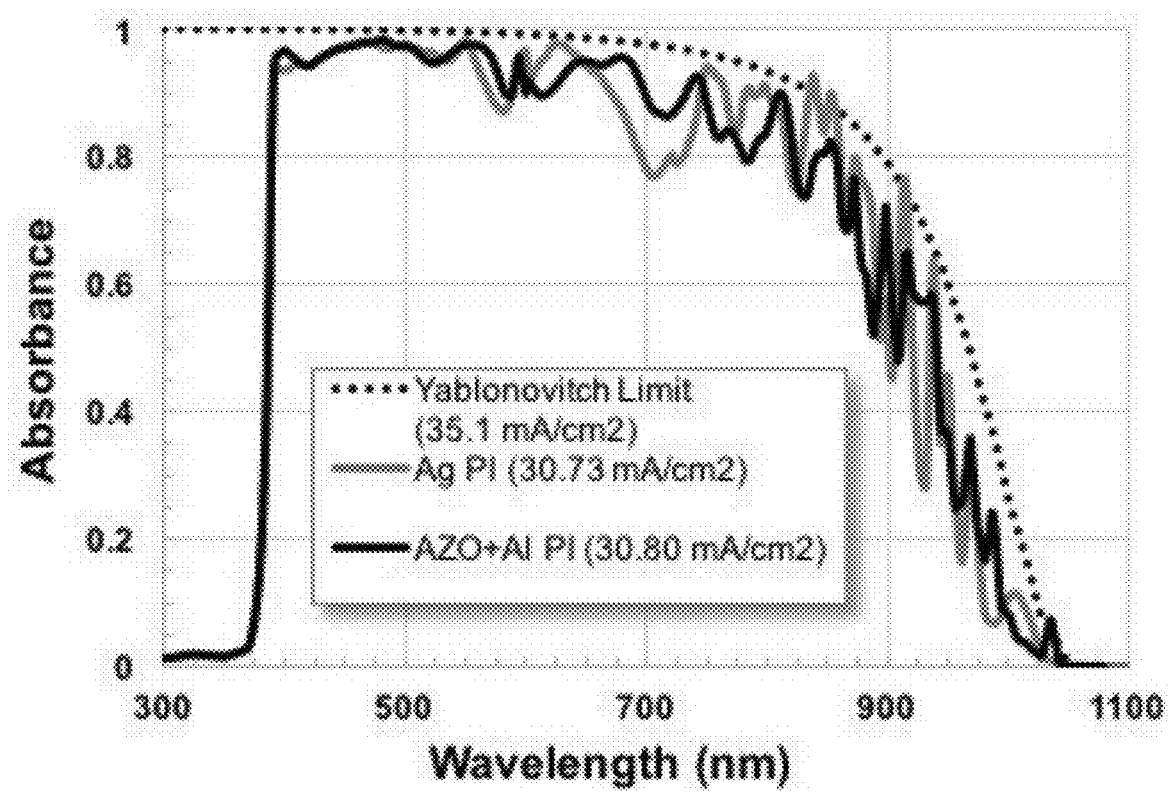

The performance of protrusion array—Form (1) R/EBC cells is superior to that of their corresponding planar (no protrusion array) cells. For the situation when the metal is Ag in the Form (1) cell, the $J_{SC}$ is increased by 70% over the $J_{SC}$ of the corresponding planar cell. However, it is very important to stress that the Form (3) periodic protrusion array—thick TCM/metal BR/E cells can give behavior (See FIG. 6(b)) that is superior to that of protrusion array—Ag Form (1) R/EBC cells. Surprisingly, this can occur even when using Al, with its inherently larger plasmonic losses compared to Ag, as the metal in the thick TCM/metal Form (3) R/EBC cell of FIG. 6(b). This outstanding performance may be seen in the plots and $J_{SC}$ tabulations in FIG. 6(b).

CITED REFERENCES (1) S. Fonash, Solar Cell Device Physics, Elsevier (2010)
(2) C. Ballif, J. Appl. Phys. 2009, 106, 044502.
(3) V. E. Ferry, A. Polman, H. A. Atwater, ACS Nano. 2010, 5, 10055.
(4) Jeehwan Kim, Corsin Battaglia, Mathieu Charrière, Augustin Hong, Wooshik Jung, Hongsik Park, Christophe Ballif, and Devendra Sadana, Adv. Mater. 2014, 26, 4082.

While three exemplary embodiments have been presented in the foregoing detailed description, it should be appreciated that a vast number of variations exist. It should also be appreciated that the exemplary embodiments are only examples, and are not intended to limit the scope, applicability, or configuration of the described embodiments in any way. Rather, the foregoing detailed description will provide those skilled in the art with a convenient road map for implementing the exemplary embodiments. It should be understood that various changes can be made in the function and arrangement of elements without departing from the scope as set forth in the appended claims and the legal equivalents thereof.

The invention claimed is:

1. A photovoltaic or detecting device having a light-entry surface, the device comprising:
    an array of dome or dome-like protrusions at the light-entry surface and having at least one layer being an active region and another layer being a top electrode of the device;
    the active region intermediate between said top electrode and a back electrode also defining a metal-less reflector;
    said metal-less reflector and back electrode being planar and continuous and contains no metal layers, is electrically conducting, and has a thickness of 0.2 to 400 nm;
    an electrically conductive layer forming a back contact on a planar substrate having no required or significant optical function as a reflector and serves only as an electrical conduit; and
    said planar substrate supporting said back contact.

2. The device of claim 1 wherein each dome or dome-like protrusions of said array of dome or dome-like protrusions has a width dimension D and an array hexagonal pattern spacing dimension L such that L is equal to or larger than D.

3. The device of claim 1 wherein said active region has an active layer top interface that is at least partially in one of said array of dome or dome-like protrusions and wherein a terminal protrusion layer before the active region interface has an optical frequency index of refraction n less than or essentially equal to that of said active region.

4. The device of claim 1 wherein said array of dome or dome-like structures contains nano-elements.

5. The device of claim 4 wherein said nano-elements are positioned on said substrate.

6. The device of claim 1 wherein said substrate is formed of polyacetylene, polyphenylene vinylene, polypyrrole, polythiophene, polyaniline or polyphenylene sulfide.

7. The device of claim 1 wherein a portion of said array of dome or dome-like protrusions is positioned between grids used in charge collection at the front of the device.

8. The device of claim 1 wherein a portion of said array of dome or dome-like protrusions is positioned between trenches used in charge collection at the front of the device.

9. The device of claim 4 wherein said nano-elements comprise a polymer.

10. The device of claim 1 wherein the device operates as a solar cell.

11. The device of claim 1 wherein said electrically conductive layer is a metal.

12. The device of claim 11 wherein said metal is aluminum.

* * * * *